United States Patent
Andry et al.

(10) Patent No.: US 7,501,708 B2
(45) Date of Patent: Mar. 10, 2009

(54) MICROELECTRONIC DEVICE CONNECTION STRUCTURE

(75) Inventors: Paul Stephen Andry, Yorktown Heights, NY (US); Steven Lorenz Wright, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 11/461,148

(22) Filed: Jul. 31, 2006

(65) Prior Publication Data

US 2008/0023851 A1  Jan. 31, 2008

(51) Int. Cl.
  *H01L 23/48* (2006.01)
  *H01L 23/52* (2006.01)
  *H01L 29/40* (2006.01)
(52) U.S. Cl. .............................. 257/778; 257/E23.021
(58) Field of Classification Search ................. 257/778, 257/737, 738, 731, 732, 733, 782, 786, E23.015, 257/E23.02, E23.021, E23.023, E23.069
See application file for complete search history.

(56) References Cited

U.S. PATENT DOCUMENTS

| | | | |
|---|---|---|---|
| 5,633,198 A | 5/1997 | Lur et al. | |
| 5,937,320 A | 8/1999 | Andricacos et al. | |
| 6,077,726 A | 6/2000 | Mistry et al. | |
| 6,815,324 B2* | 11/2004 | Huang et al. | 438/612 |
| 6,822,327 B1 | 11/2004 | Mithal et al. | |
| 2006/0060939 A1* | 3/2006 | Seto et al. | 257/531 |

OTHER PUBLICATIONS

K.N. Tue, et al., J. Applied Physics 94 5451 (2003).
A. Yeoh et al, "Copper Die Bumps (First Level Interconenct) and low-K Dielectrics in 65-nm High Volume Manufacturing", pp. 1611-1615, Electronic Components and Technology Con.
J-W Nah et al., "Electromigration in Pb-free Solder Bumps with Cu Columns as Flip-Chip Joints", pp. 657-662, Electronic Components and Technology Conference, May 2006.

* cited by examiner

*Primary Examiner*—A. Sefer
*Assistant Examiner*—Dilinh P Nguyen
(74) *Attorney, Agent, or Firm*—Vazken Alexanian

(57) ABSTRACT

The invention broadly and generally provides a connection structure for connecting a microelectronic device to a substrate, the aforesaid connection structure comprising: (a) a metal layer electrically connected to the aforesaid microelectronic device; (b) an interface element attached to an interface portion of the aforesaid metal layer; (c) a metallic solder element attached to the aforesaid interface element at an interface region of the aforesaid metallic solder element; and (d) a current dispersing structure operable to spatially disperse an electric current, the aforesaid current dispersing structure comprising an electrically insulating material and being disposed within at least one of the aforesaid interface portion, the aforesaid interface element, and the aforesaid interface region.

19 Claims, 9 Drawing Sheets

MICROELECTRONIC DEVICE CONNECTION STRUCTURE

FIELD OF THE INVENTION

The present invention relates to the design of flip-chip packages and similar packaging technologies which utilize solder bump interconnections. Specifically, the invention provides a contact pad structure and method to increase the contact electrical and mechanical reliability.

BACKGROUND OF THE INVENTION

Solder bump interconnections are used in flip-chip and other packaging technologies. The bump connections between the integrated circuit chip and substrate are historically referred to as Controlled-Collapse Chip Connections (C4). For many applications, power and ground bump interconnections are required to carry high currents, and these C4 interconnections are subject to electromigration or thermal failure.

For 100 μm diameter solder bumps placed on a pitch of 200 μm (commonly referred to as 4-on-8 bump arrays), a typical maximum current specification is 200 mA per bump, corresponding to an average current density through the bump of 2.3 kA/cm$^2$. However, for practical designs of chip and substrate wiring, the current flow through the bump is not uniform, and peak current densities are much higher than the average density. This effect, known as current crowding, occurs due to the spreading resistance of different contact regions which constrict the current flow. This effect is illustrated in FIG. 1 and FIG. 2. There are many reports of studies concerning current crowding in C4 interconnections; a recent published review is K. N. Tu et al., J. Applied Physics 94 5451 (2003), and references contained therein.

The combination of peak current density exceeding about 10 kA/cm$^2$, and chip temperatures in excess of 100° C., cause thermal and electromigration effects which eventually cause contact failure. The electromigration rate typically follows a Black's law relationship, where the failure rate increases roughly as the square of the peak current density. The failure mechanisms involve the formation of intermetallic compounds, particularly between the Sn solder component and various metallic components of the contact pad structure and wiring metal such as Cu or Al. As compared to the base solder material, the intermetallic compounds are brittle, and under thermal and electrical stress, tend to spall into the solder bump. Electromigration effects lead to formation of voids and cracks which eventually cause electrical failure of the contact.

For many applications, there is also a need to increase the bump array contact density to the chip, both for the purposes of increasing signal input-output capacity and also to improve control and performance of power distribution. Standard 4-on-8 bump arrays are being replaced with 3-on-6 designs, with 1-on-2 bump array technology under development. As the bump size decreases, the volume to surface area ratio decreases, suggesting that problems with intermetallic formation in small bumps will increase proportionately. Furthermore, unless the power supply and ground wiring is carefully scaled to match the bump density, there will be a tendency for average current density to increase for smaller bumps.

The strategies for formation of highly-reliable bump interconnections can be described in three categories. One strategy involves routing current to the interconnection through multiple wires from multiple directions in order to minimize the density of the current arriving at an interconnection to reduce the rate of electromigration in a bump structure. A second strategy utilizes barrier layer materials in contact with the solder. These barrier layer materials have an initial reaction with the solder during reflow to form certain stable intermetallic compounds, which further react slowly with the solder during subsequent thermal and electrical stress, to reduce the rate of electromigration failure. Yet another strategy involves increasing mechanical adhesion and integrity to extend the contact lifetime as electromigration effects proceed.

A common approach taken to improve interconnect electromigration lifetime is to route the current through multiple wires in order to spread the current as much as possible before the current reaches the interconnection and bump structure. For power or ground interconnections which must carry large currents, multiple wiring lines are connected to the bump contact pad as in FIGS. 8-11. To spread the current, the contact pad is made as large as possible, and the chip wiring is often connected to all four orthogonal sides of a contact pad. Wiring layout restrictions may limit the extent to which this approach can be implemented. Multiple pad contact lines can reduce current non-uniformities.

A straightforward method to improve the current uniformity in the interior of the pad, near the via edge of the bump-to-pad interface, is to increase the thickness of the top wiring level metal layer. If the thickness of the pad can be increased to approach the thickness of the bump, then the current distribution inside the bump will be nearly uniform. However, technological limitations of damascene processing for chip-side wiring generally restrict the maximum thickness of the top-level wiring to about 1 to 2 μm, far less than bump thicknesses which may span the range of about 10 μm to 100 μm. For typical organic or ceramic technology, the thickness of the wiring on the substrate side of the bump can be made moderately thick, about 20 μm. For small bumps with a diameter similar to the substrate wiring thickness, the current distribution on the substrate side of the bump will be relatively uniform. However, for bumps with a diameter much larger than the substrate wiring thickness, the current distribution will not be highly uniform on either the substrate site or the chip side of the bump. While thick substrate pad and wiring improves the distribution of current on the substrate side, in particular there remains a problem of current crowding on the chip side of the bump. The current is crowded near the edge of the bump, where contact pad metal intersects the bump.

One structure which increases the distance between the current crowded region and the solder is described by A. Yeoh et al., "Copper Die Bumps (First Level Interconnect) and low-K Dielectrics in 65-nm High Volume Manufacturing", pp. 1611-1615, Electronic Components and Technology Conference, May 2006. In this structure, a thick Cu metal pillar replaces much of the solder bump; only a small solder region is present between the Cu pillar and substrate pad metal. Although the current is crowded at the intersection of the thin chip-side wiring and the Cu pillar, the current spreads out within the electrically conductive Cu pillar and becomes nearly uniform at the interface between the Cu pillar and solder metal. This Cu pillar technology is presently thought to have both advantages and disadvantages as compared to conventional C4 technology. A study of electromigration characteristics of Cu pillar structures has been described by J-W Nah et al., "Electromigration in Pb-free Solder Bumps with Cu Columns as Flip-Chip Joints", pp. 657-662, Electronic Components and Technology Conference, May 2006.

A second strategy and common approach taken to improve bump contact reliability is to form layered pad metal structures with materials which have minimal chemical interaction with the C4 ball metal alloy, and form a barrier layer between the solder and wiring metal. The pad layer structure on the chip side of the bump has commonly been referred to as ball-limiting metallurgy (BLM) or under-bump-metallurgy (UBM). The pad layer structure on the substrate side is typically referred to as top-surface-metallurgy (TSM) or substrate pad surface finish. Typically, the BLM barrier layer pad materials contain refractory metals or near-refractory metals such as Ni, Cr, W or Ti. These barrier layer materials help suppress the formation of undesirable intermetallic compounds with the solder. Some form of barrier layer structure is needed to achieve good interconnect reliability, however, the most aggressive barrier layer structures utilized to date still do not guarantee very high interconnect reliability, particularly for Pb-free solder materials.

Typical solder bump materials may include a family of PbSn mixtures with different melting temperatures, spanning the range from eutectic PbSn, containing 37% Pb, up to "high-Pb" solder containing 95% Pb. Other solder materials are based on alloys containing metals such as In, Ag, Au, Zn, and Bi. For some time, there has been public concern about the use of Pb in electronic packaging, and there is a strong interest to incorporate "Pb-free" packaging solutions wherever possible. The Pb-free solder materials proposed to date are all based on the use of Sn as a major constituent, with minor components such as Cu and or Ag. There are many challenges to develop a robust interconnect contact technology based on Sn. Of these, it is known that the rate intermetallic formation increases with Sn composition in the solder.

A third general problem with C4 connections is physical adhesion, or mechanical bond strength. Metallic materials such as Cr or Ti are typically used to improve adhesion. These materials add manufacturing cost and can introduce additional complications. For example, Ti readily reacts with oxygen and hydrogen, creating compounds with high electrical resistivity, and which are subject to rapid chemical attack during processing. Since the electrical failure of bump contacts occurs concurrently with mechanical failure, improvement of mechanical adhesion is believed to increase contact reliability. New methods are needed to improve adhesion, without the introduction of additional metal materials.

A variety of structures and methods have been described to improve electromigration lifetime in Cu or Al wiring in chip back-end-of-line (BEOL) structures. It is known that the formation of grain boundaries perpendicular to current flow inhibits electromigration, called "bamboo" structures. Some of these approaches seek to inhibit electromigration through the construction of regions which do not allow grain boundaries form parallel to current flow, or suppress grain boundary formation altogether. Other approaches include the formation of refractory metal regions or plugs arranged in patterns with a periodicity smaller than the Blech length. For wire traces with sharp corners, Lur et al., U.S. Pat. No. 5,633,198, issued May 27, 1997, describes the use of parallel slots to spread out the current from the corner. However, the preferred embodiment shows a particular slot pattern which would not reduce current crowding.

One example of the suppression of flip-chip C4 electromigration failure is Mithal et al., U.S. Pat. No. 6,822,327 issued Jun. 20, 2000. Mithal describes a plurality of separate electrical "runner" wiring paths which supply current around the periphery of a bump.

Mistry et al., U.S. Pat. No. 6,077,726, issued Nov. 23, 2004. describes a means of reducing mechanical stress in C4 bumps through incorporation of a polyimide layer over the surface and edge of a passivation layer, within the contact pad region.

There are numerous examples of the use of various barrier layer materials in the bump contact pad region. One such example is Andricacos et al., U.S. Pat. No. 5,937,320 issued Aug. 10, 1999.

SUMMARY OF THE INVENTION

The invention broadly and generally provides a connection structure for connecting a microelectronic device to a substrate, the aforesaid connection structure comprising: (a) a metal layer electrically connected to the aforesaid microelectronic device; (b) an interface element attached to an interface portion of the aforesaid metal layer; (c) a metallic solder element attached to the aforesaid interface element at an interface region of the aforesaid metallic solder element; and (d) a current dispersing structure operable to spatially disperse an electric current, the aforesaid current dispersing structure comprising an electrically insulating material and being disposed within at least one of the aforesaid interface portion, the aforesaid interface element, and the aforesaid interface region.

Beneficially, the aforesaid current dispersing structure may project into and mechanically interlock with the aforesaid metallic solder element. The aforesaid current dispersing structure may comprise a plurality of protrusions projecting from the aforesaid interface element into the aforesaid metallic solder element.

The aforesaid current dispersing structure may comprise a barrier layer operable to inhibit electromigration between the aforesaid metal layer and the aforesaid metallic solder element.

In some embodiments, the aforesaid protrusions may have lateral dimensions of no more than 10 microns. These protrusions may be disposed in continuous concentric rings. The aforesaid interface element may have a periphery area and an interior area, wherein the aforesaid protrusions may be more closely spaced together near the periphery area than near the aforesaid interior area.

The aforesaid metal layer may comprise a hole disposed in spaced adjacency to the aforesaid interface portion. In some embodiments, this hole may comprise an electrically insulating material.

The aforesaid current dispersing structure may comprise a plurality of holes formed into the aforesaid metal layer. These holes may extend completely through the aforesaid metal layer and may be filled with an electrically insulating material.

In some embodiments, the aforesaid metal layer may comprise an element selected from the group including Ti, W, Ni Ru, Cr, and Si. The aforesaid insulating material may, for example, be comprised of at least one of silicon dioxide, silicon nitride, polymide, or an electrically-insulating voided region.

The invention further broadly and generally provides a microelectronic device comprising a connection structure for connecting the aforesaid microelectronic device to a substrate, the aforesaid connection structure comprising: (a) a metal layer electrically connected to the aforesaid microelectronic device; (b) an interface element attached to an interface portion of the aforesaid metal layer; (c) a metallic solder element attached to the aforesaid interface element at an interface region of the aforesaid metallic solder element; and (d) a current dispersing structure operable to spatially disperse an electric current, the aforesaid current dispersing structure comprising an electrically insulating material and being disposed within at least one of the aforesaid interface portion, the aforesaid interface element, and the aforesaid interface region.

The invention further broadly and generally provides an apparatus comprising a microelectronic device, the aforesaid microelectronic device comprising a connection structure for connecting the aforesaid microelectronic device to a substrate, the aforesaid connection structure comprising: (a) a metal layer electrically connected to the aforesaid microelectronic device; (b) an interface element attached to an interface portion of the aforesaid metal layer; (c) a metallic solder element attached to the aforesaid interface element at an interface region of the aforesaid metallic solder element; and (d) a current dispersing structure operable to spatially disperse an electric current, the aforesaid current dispersing structure comprising an electrically insulating material and being disposed within at least one of the aforesaid interface portion, the aforesaid interface element, and the aforesaid interface region.

DETAILED DESCRIPTION OF PREFERRED EMBODIMENT

Figure 1:
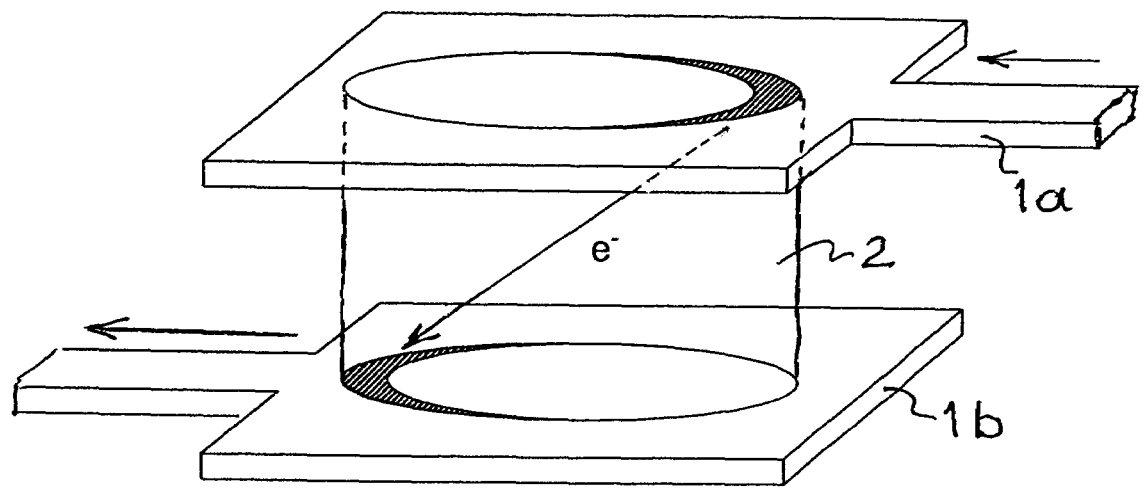
FIG. 1 is a schematic view of a connection structure in accordance with the prior art.

FIG. 1 is a schematic view of a connection structure in accordance with the prior art. In FIG. 1, electrons move from a first metal layer 1a through a metallic solder element 2 to a second metal layer 1b. Heat and current density extremes at the interfaces between the metal layers 1a and 1b and the metallic solder element 2 can lead to interface damage which can interrupt the electrical conductivity.

Figure 2:
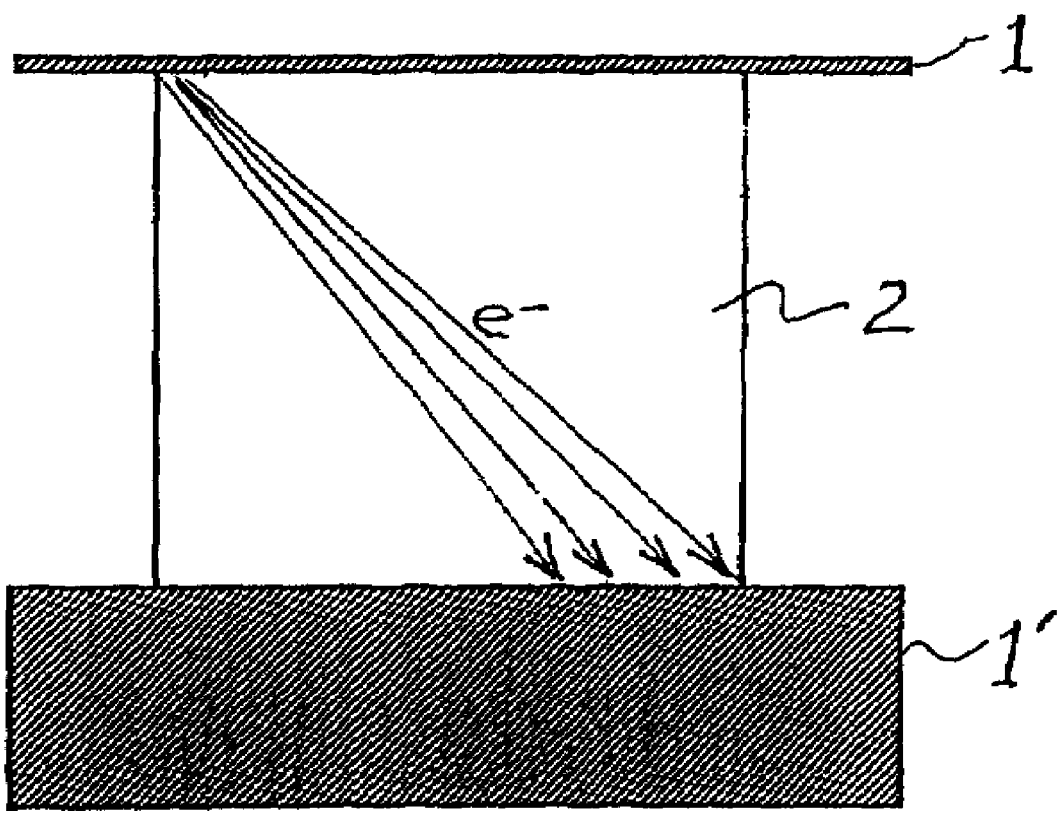
FIG. 2 is an interconnection structure in accordance with the prior art.

FIG. 2 is another connection structure in accordance with the prior art. FIG. 2 graphically depicts differences in current density through regions of the metallic solder 2 between a thin metal layer 1 and a thicker metal layer 1'. As previously discussed, the interconnection portions using a thicker metal layer are often more resistant to current crowding. However, for various reasons, it is not always possible to construct interconnects using only thick metal layers.

Figure 3:
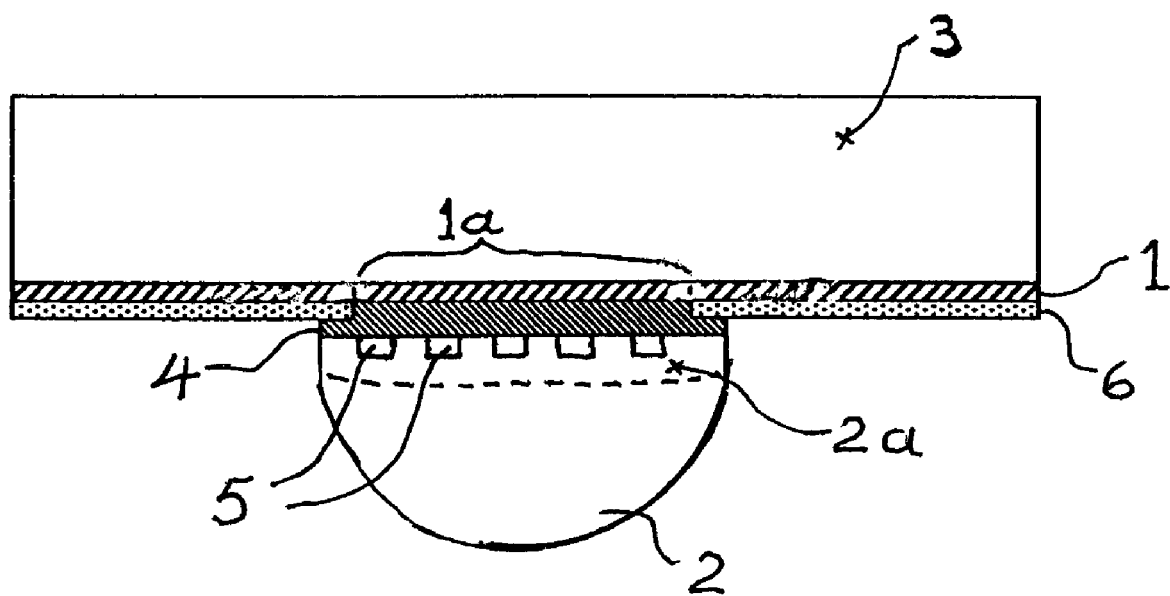
FIG. 3 is a schematic view of a connection structure for connecting a microelectronic device to a substrate in accordance with the present invention.

FIG. 3 is a schematic view of a connection structure for connecting a microelectronic device 3 to a substrate in accordance with the present invention. The connection structure is made of a metal layer 1 which is electrically connected to a microelectronic device 3. The metal layer 1 has an interface portion 1a which is attached to an interface element (the contact pad) 4. A metallic solder element 2 connects to the interface element 4 at an interface region 2a of the solder element 2. As taught in this invention, a current dispersing structure 5 is disposed within at least one of the interface portion 1a, the interface element 4 and the interface region 2a (as in the case of FIG. 3). In some embodiments, the interface region 2a of the metallic solder may be an ideal location for the placement current dispersing structures 5, as will be discussed. The current dispersing structure 5 is operable to spatially disperse an electric current. The current dispersing structure comprises an electrically insulating material, for example silicon dioxide, silicon nitride, polymide, or an electrically-insulating voided region. The structure can be fabricated using standard back-end-of-the-line fabrication techniques, including the processes of photolithography, chemical vapor deposition, reactive ion etching, evaporation, sputter deposition, plating, chemical-mechanical polishing or other semiconductor processing technologies well known in the art.

Figure 4:
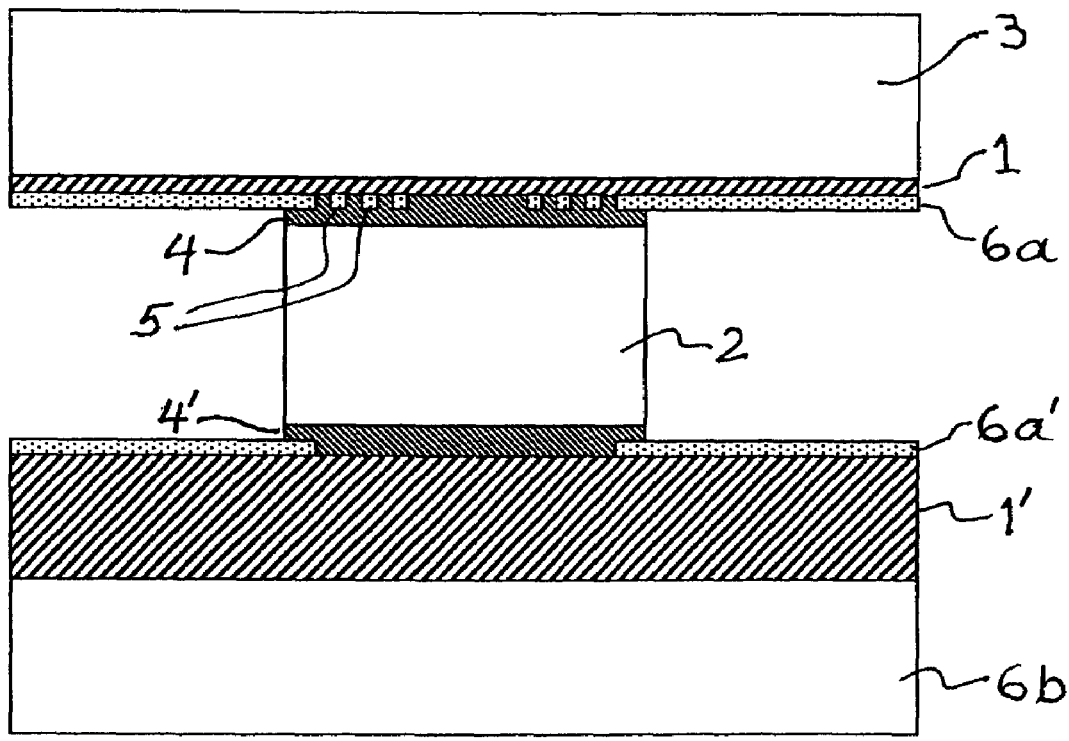
FIG. 4 shows a schematic view of a connection structure containing insulator posts in accordance with the present invention.

FIG. 4 is a schematic view of an exemplary connection structure for connecting a microelectronic device 3 to a substrate in accordance with the present invention. In this example, the microelectronic device 3 is connected to a metal layer 1. The metal layer 1 may be covered with an insulating layer 6a. An interface element 4 connects the metal layer 1 to the metallic solder 2. FIG. 4 shows a current dispersing structure 5 disposed within the interface element 4. On the other side of the metallic solder 2, an interface element 4' is shown without a current dispersing structure. Microelectronic device designs employing the present invention may provide current dispersing structures at every connection or at any subset of connections, depending on current density and other requirements. The thicker metal layer 1' shown in FIG. 4 may be dispersive enough in and of itself to not require an additional dispersing structure.

Figure 5:
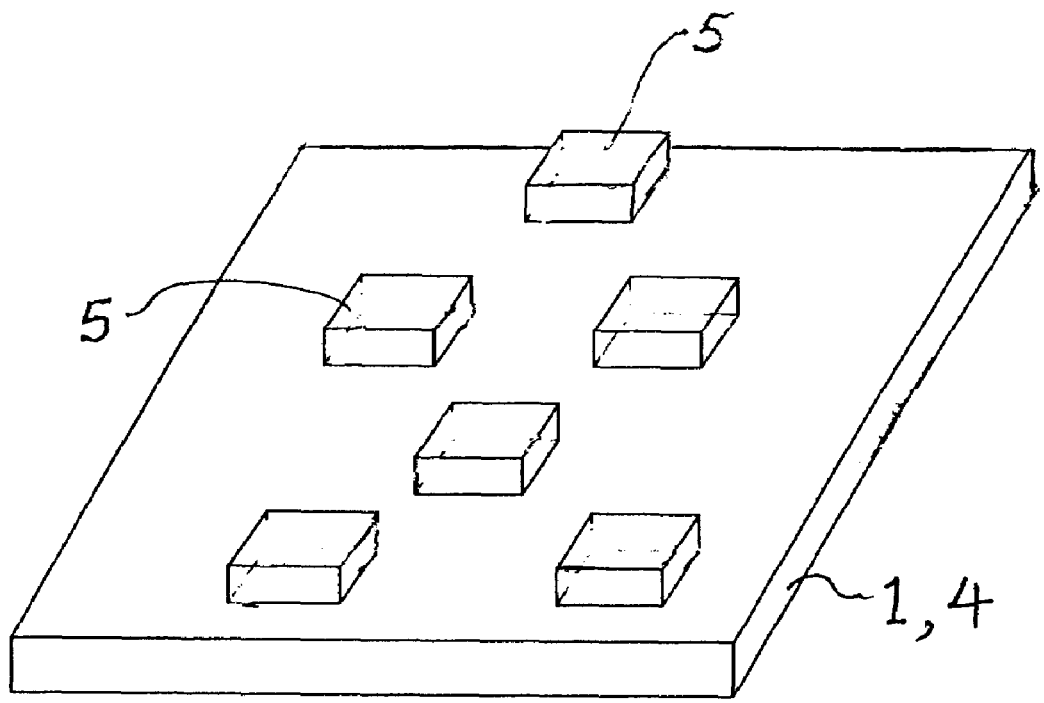
FIG. 5 shows a current dispersing structure connected to a layer of the connection structure shown in FIG. 4.

FIG. 5 shows the detail of a current dispersing structure 5 connected to a layer of the connection structure of FIG. 4. As described above, the current dispersing structure is disposed within at least one of the interface portion of the metal layer 1, the interface element 4, or the interface region of the metallic solder element 2. The current dispersing structure 5 in FIG. 5 is shown protruding from the layer beneath it. Such interlayer protrusions can provide a mechanical interlock between layers, providing a more robust connection that will be appreciably more resistant to failure. There are benefits to keeping the lateral dimensions of the protrusions (or pillars) to no more than 10 microns.

Figure 6:
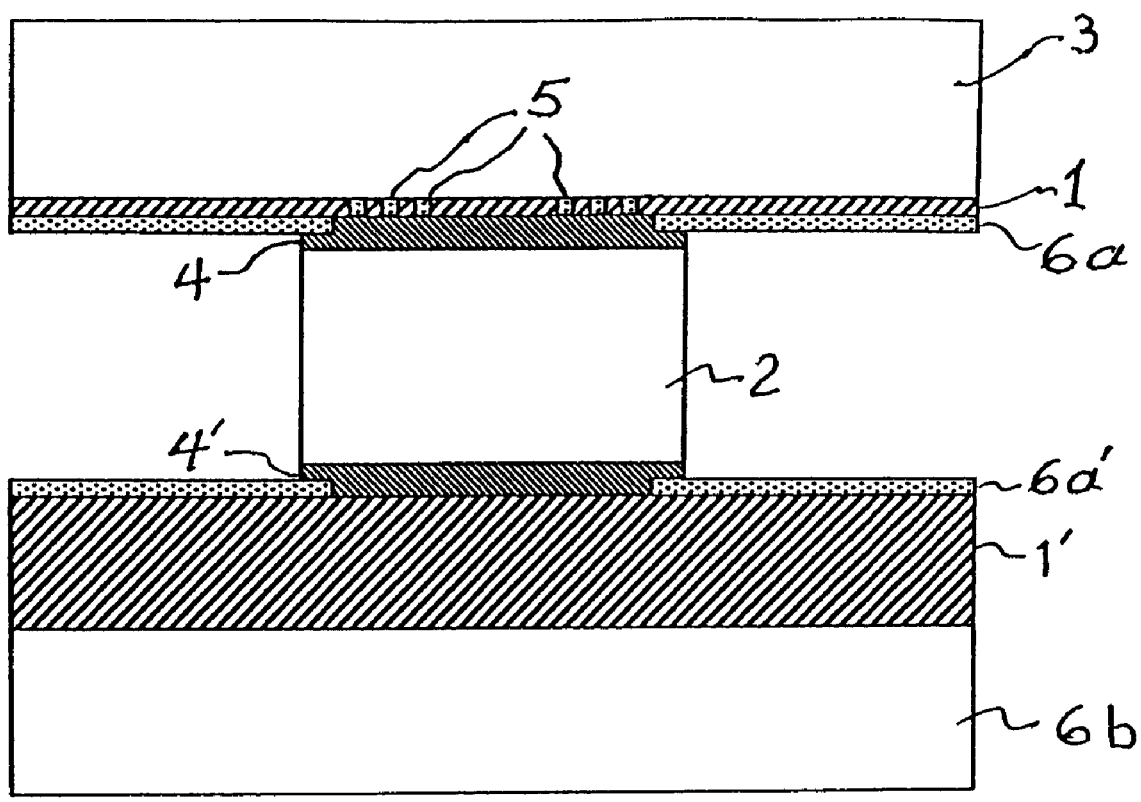
FIG. 6 shows a current dispersing structure within the interface portion of a metal layer of the connection structure according to a different embodiment of the present invention.

FIG. 6 shows a schematic view of an exemplary connection structure in accordance with the present invention. Here, the current dispersing structure 5 is in the form of an insulating material within the interface portion of the metal layer 1. As discussed, the current dispersing structure 5 may also be in the interface element or the interface region of the metallic solder element. The current dispersing structure 5 may be constructed, for example, using existing back end of the line (BEOL) fabrication techniques including photolithography, plating, and sputter deposition. Other methods for constructing the current dispersing structure may also be suitable.

Figure 7:
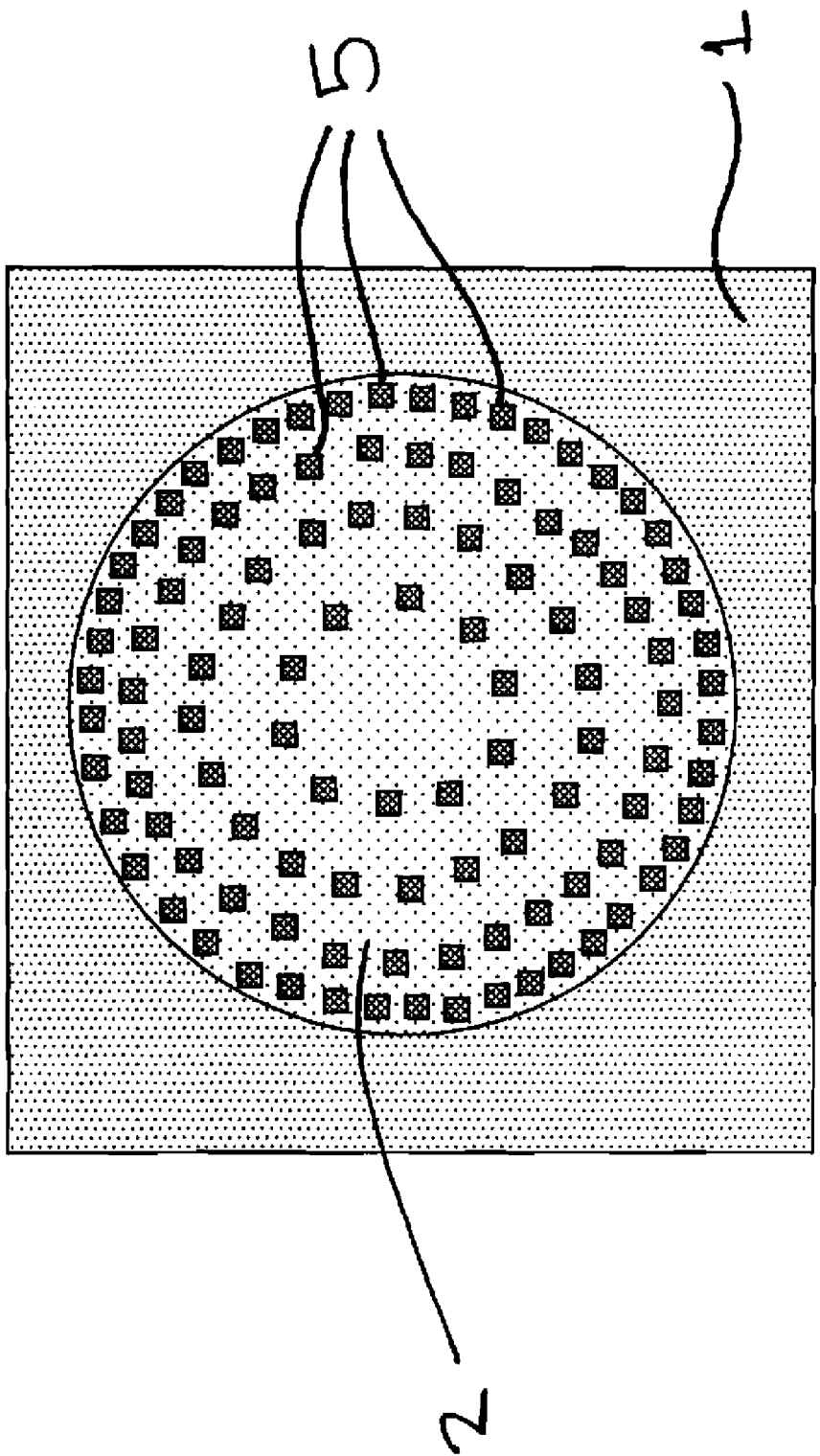
FIG. 7 shows a pad portion of a connection structure where insulating pillars are arranged in a regular distribution in accordance with the present invention.
Figure 11:
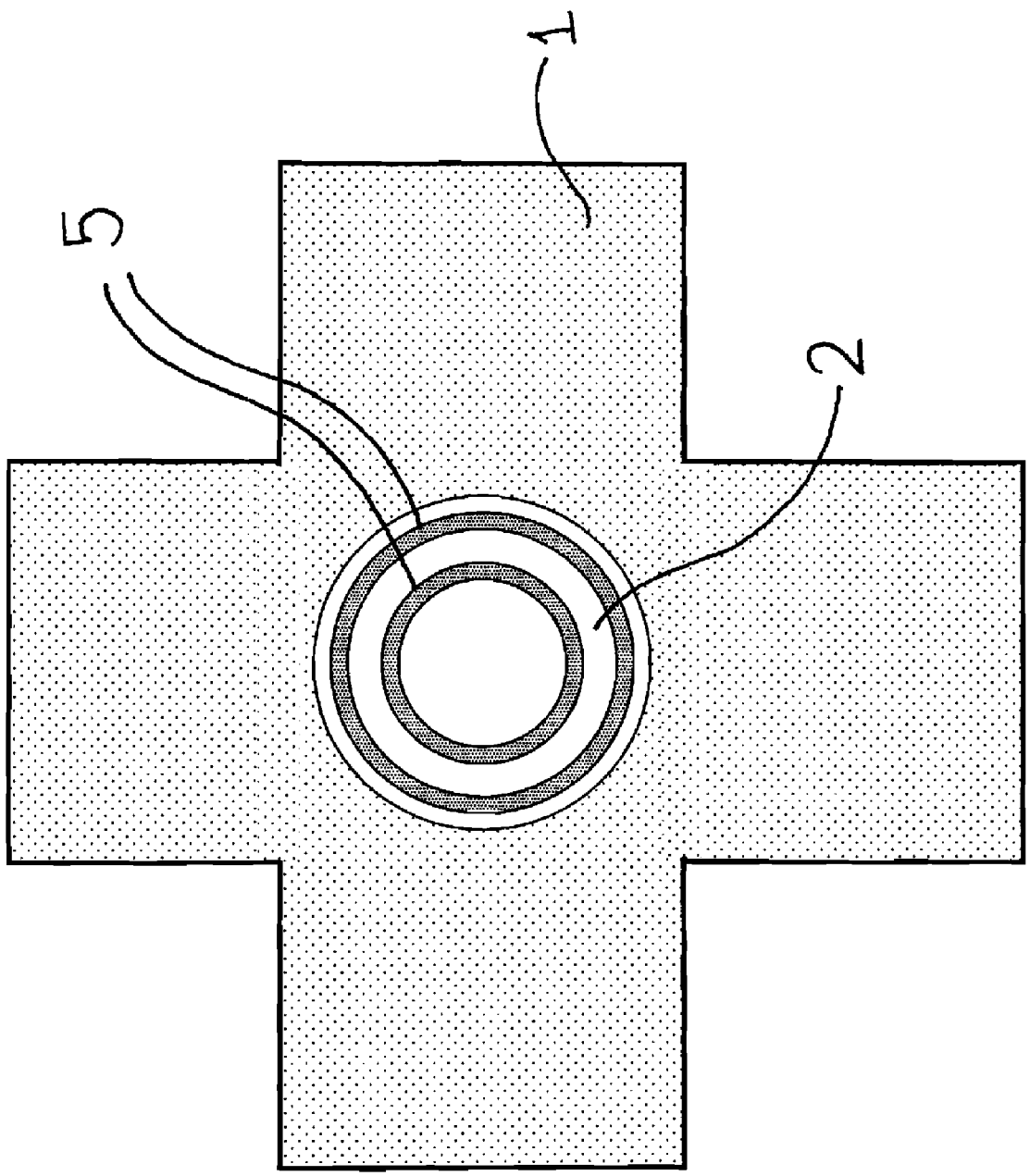
FIG. 11 shows a connection structure in accordance with the present invention wherein the current dispersing structure is disposed in continuous concentric rings.

FIG. 7 shows a plan view of a current dispersing structure in accordance with the present invention. The current dispersing structure can be formed arranging electrically insulating material in a series of concentric rings with a higher density of insulation towards the periphery of the interface element. If desired, the current dispersing structure can be a series a of continuous concentric rings of electrically insulating material in order to aggressively force the current towards the center of the metallic solder 2 as shown in FIG. 11.

Figure 8:
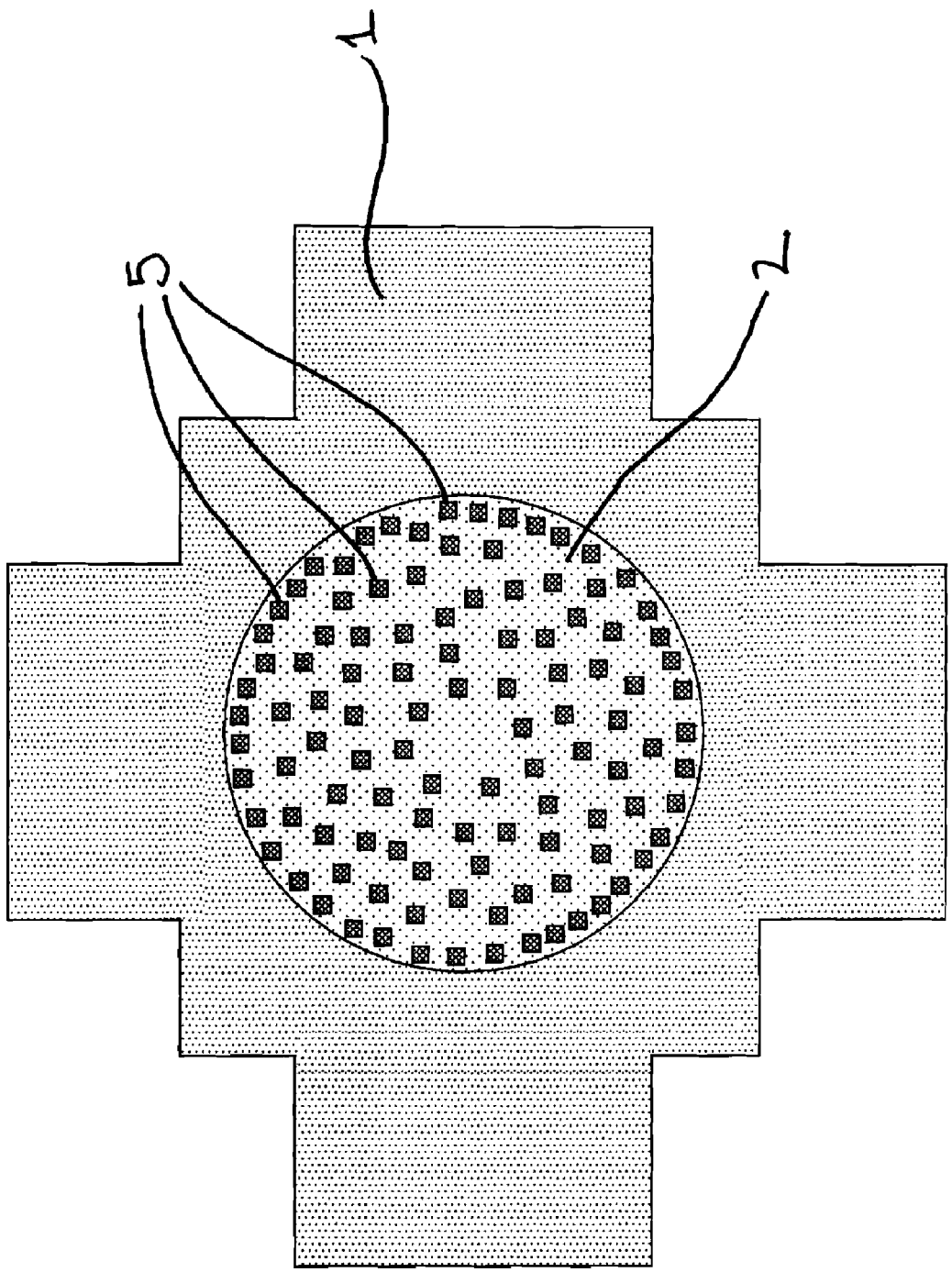
FIG. 8 shows a pad portion of a connection structure where insulating pillars are arranged in an irregular distribution in accordance with the present invention.
Figure 9:
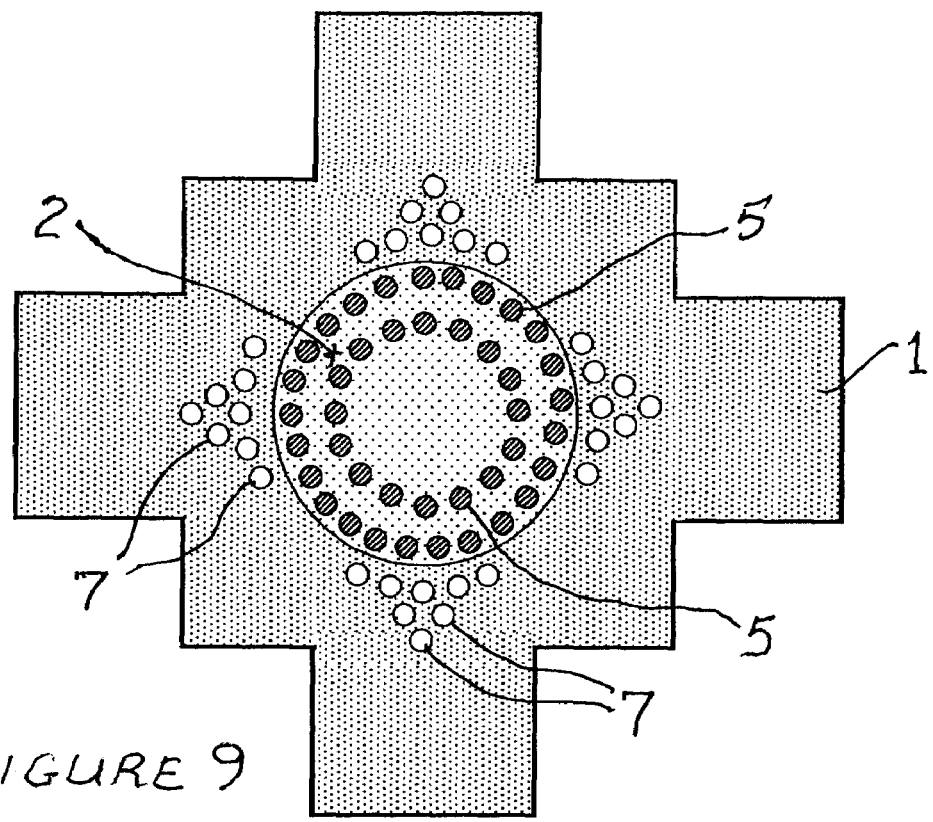
FIG. 9 shows a connection structure in accordance with the present invention wherein holes have been cut into the copper outside of the pad portion of the connection structure.
Figure 10:
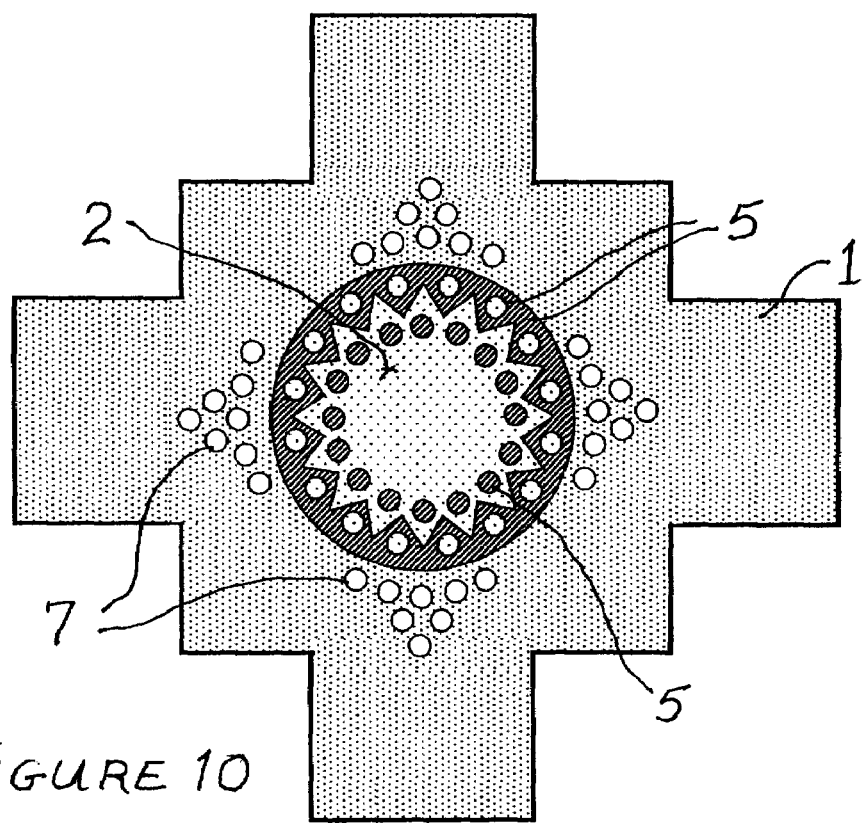
FIG. 10 shows a connection structure in accordance with the present invention wherein the edges of the current dispersing structure are crenelated to further distribute the current.

FIG. 8 shows a plan view of a current dispersing structure 5 in accordance with the present invention. In FIG. 8, the current dispersing structure is takes the form of electrically insulating material which is distributed with less regularity than in FIG. 7. Where the current dispersing structure 5 comprises electrically insulating material, various current dispersing effects can be obtained by using insulating materials with varying electrical resistances and by arranging the materials in different shapes and sizes. FIG. 9 and FIG. 10 show alternate arrangements of insulating material and metallic solder for exemplary connection structures. In FIG. 9 and FIG. 10, the metal layer 1 has holes 7 which are in spaced adjacency to the interface portion (or contact pad). These holes 7, which may be filled with an insulating material, may be used in combination with the aforementioned current dispersing structure 5 to further reduce the current density through portions of the connection structure.

A current dispersing structure containing a plurality of crenellations, as shown in FIG. 10, provides a means to improve contact reliability and mechanical integrity in flip-chip solder bump interconnections. The crenellations decrease current crowding thereby increasing electromigration lifetime, and improve mechanical adhesion. The crenellations are non-planar features in the current dispersing structure and contact pad structure consisting of insulator regions or holes in the pad metallurgy.

The detailed structure and placement of the crenellations to achieve optimal current spread may require computer-assisted modeling of the current flow. However, some guiding principles for design can be described. For good mechanical adhesion, it is desired that the aspect ratio of insulator regions approach 1:1, namely that the width of the insulator regions be approximately the same as the height of the insulator regions. The horizontal placement and spacing of the insulator regions can be chosen to increase the lateral current spread, within the limitations incurred due to presence of a large sheet resistance of the pad metal layer relative to the resistance of the solder metal region.

A good balance between different design considerations can be achieved by choosing the gap distance between insulator regions to gradually increase toward the interface portion (or pad) center. In the gap regions, the solder, BLM and pad metal layers are in contact. In the insulator crenellation regions, the solder and BLM layers are in contact with each other, and there is an insulator region which separates the contact pad metal from the BLM layer. In many situations where there is current crowding, the current falls off exponentially with distance from the constricted portion. As a rough rule of thumb, the width of the outermost gap between insulator regions should be somewhat smaller than the characteristic length for the current falloff from the edge. Toward the center of the contact pad via, the gaps between the insulator crenellations can be gradually increased, such that the areal density of insulator regions is decreased.

A common scenario is that the pad sheet resistance is large relative to the bulk solder resistance, and in this case, a large benefit in current spreading will be achieved with the addition of several crenellations. As the number of crenellations is increased, the contact resistance is increased. As apparent to one skilled in the art, the benefit of additional crenellations must be balanced with the consequences of increased contact resistance.

While changes and variations to the embodiments may be made by those skilled in the art, the scope of the invention is to be determined by the appended claims.

The invention claimed is:

1. A connection structure for connecting a microelectronic device to a substrate, said connection structure comprising:
   (a) a metal layer electrically connected to said microelectronic device;
   (b) an interface element attached to an interface portion of said metal layer;
   (c) a metallic solder element attached to said interface element at an interface region of said metallic solder element; and
   (d) a current dispersing structure operable to spatially disperse an electric current, said current dispersing structure comprising an electrically insulating material and being disposed within at least one of said interface portion, said interface element, and said interface region;
   wherein said current dispersing structure projects into and mechanically interlocks with said metallic solder element.

2. A connection structure as set forth in claim 1, wherein said current dispersing structure comprises a plurality of protrusions projecting from said interface element into said metallic solder element.

3. A connection structure as set forth in claim 2, said current dispersing structure comprises a barrier layer operable to inhibit electromigration between said metal layer and said metallic solder element.

4. A connection structure as set forth in claim 2, said protrusions having lateral dimensions of no more than 10 microns.

5. A connection structure as set forth in claim 2, wherein said protrusions are disposed in continuous concentric rings.

6. A connection structure as set forth in claim 2, said interface element having a periphery area and an interior area, wherein said protrusions are more closely spaced together near the periphery area than near said interior area.

7. A connection structure as set forth in claim 1, said metal layer comprising a hole disposed in spaced adjacency to said interface portion, said hole comprising an electrically insulating material.

8. A connection structure as set forth in claim 1, said current dispersing structure comprising a plurality of holes formed into said metal layer.

9. A connection structure as set forth in claim 8, wherein at least one of said plurality of holes extends completely through said metal layer.

10. A connection structure as set forth in claim 8, wherein at least one of said plurality of holes is filled with an electrically insulating material.

11. A connection structure for connecting a microelectronic device to a substrate, said connection structure comprising:
   (a) a metal layer electrically connected to said microelectronic device;
   (b) an interface element attached to an interface portion of said metal layer;
   (c) a metallic solder element attached to said interface element at an interface region of said metallic solder element; and (d) a current dispersing structure operable to spatially disperse an electric current, said current dispersing structure comprising an electrically insulating material and being disposed within at least one of said interface portion, said interface element, and said interface region;

said metal layer comprising a hole disposed in spaced adjacency to said interface portion, said hole comprising an electrically insulating material.

12. A connection structure as set forth in claim 11, wherein said current dispersing structure comprises a plurality of protrusions projecting from said interface element into said metallic solder element.

13. A connection structure as set forth in claim 12, wherein said current dispersing structure comprises a barrier layer operable to inhibit electromigration between said metal layer and said metallic solder element.

14. A connection structure as set forth in claim 12, said protrusions having lateral dimensions of no more than 10 microns.

15. A connection structure as set forth in claim 12, wherein said protrusions are disposed in continuous concentric rings.

16. A connection structure as set forth in claim 12, said interface element having a periphery area and an interior area, wherein said protrusions are more closely spaced together near the periphery area than near said interior area.

17. A connection structure for connecting a microelectronic device to a substrate, said connection structure comprising:
   (a) a metal layer electrically connected to said microelectronic device;
   (b) an interface element attached to an interface portion of said metal layer;
   (c) a metallic solder element attached to said interface element at an interface region of said metallic solder element; and
   (d) a current dispersing structure operable to spatially disperse an electric current, said current dispersing structure comprising an electrically insulating material and being disposed within at least one of said interface portion, said interface element, and said interface region;

said current dispersing structure comprising a plurality of holes formed into said metal layer.

18. A connection structure as set forth in claim 17, wherein at least one of said plurality of holes extends completely through said metal layer.

19. A connection structure as set forth in claim 17, wherein at least one of said plurality of holes is filled with an electrically insulating material.

* * * * *